(12) United States Patent
Kim et al.

(10) Patent No.: US 6,500,763 B2
(45) Date of Patent: Dec. 31, 2002

(54) METHOD FOR MANUFACTURING AN ELECTRODE OF A CAPACITOR

(75) Inventors: Jin-won Kim, Seoul (KR); Sang-don Nam, Seoul (KR); Wan-don Kim, Suwon (KR); Kab-jin Nam, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 180 days.

(21) Appl. No.: 09/735,901

(22) Filed: Dec. 14, 2000

(65) Prior Publication Data
US 2001/0005631 A1 Jun. 28, 2001

(30) Foreign Application Priority Data
Dec. 14, 1999 (KR) .............................. 99-57626

(51) Int. Cl.[7] .................... H01L 21/302; H01L 21/3065
(52) U.S. Cl. .................... 438/689; 438/694; 438/706; 438/722; 438/723
(58) Field of Search ................ 438/689, 694, 438/706, 722, 723

(56) References Cited
U.S. PATENT DOCUMENTS

| | | | | |
|---|---|---|---|---|
| 5,162,248 A | | 11/1992 | Dennison et al. ........... 437/52 |
| 5,392,189 A | | 2/1995 | Fazan et al. ............... 361/305 |
| 5,786,259 A | * | 7/1998 | Kang ......................... 438/396 |
| 5,858,829 A | * | 1/1999 | Chen ......................... 438/238 |
| 5,902,124 A | * | 5/1999 | Hong ......................... 438/253 |
| 5,972,769 A | * | 10/1999 | Tsu et al. .................... 438/396 |
| 5,989,952 A | * | 11/1999 | Jen et al. ..................... 438/253 |

* cited by examiner

Primary Examiner—Benjamin L. Utech
Assistant Examiner—Lynette T. Umez-Eronini
(74) Attorney, Agent, or Firm—Lee & Sterba, P.C.

(57) ABSTRACT

A method for manufacturing an electrode of a capacitor used in a semiconductor device, wherein a support insulating layer, an etch stop layer including a tantalum oxide layer, and a mold sacrificial insulating layer are sequentially formed on a semiconductor substrate. The mold sacrificial insulating layer, the etch stop layer and the support insulating layer are sequentially patterned to form a three-dimensional mold for a storage node. A storage node layer is formed to cover the inner surface of the mold. Next, storage nodes for capacitors are formed by dividing the storage node layer. The residual mold sacrificial insulating layer is removed by selectively wet etching, using the tantalum oxide layer as an etch stopper.

27 Claims, 7 Drawing Sheets

METHOD FOR MANUFACTURING AN ELECTRODE OF A CAPACITOR

BACKGROUND OF THE INVENTION

1. Field of the Invention

The present invention relates to a method for manufacturing a semiconductor device. More particularly, the present invention relates to a method for manufacturing a three-dimensional capacitor electrode using an insulating layer.

2. Description of the Related Art

As the integration density of semiconductor devices increases, the area of the capacitor decreases. The required capacitance of a capacitor, however, increases. Accordingly, methods have been proposed for enlarging the effective surface area of a dielectric layer for a storage node, which is adopted in a semiconductor device, such as a dynamic random access memory (DRAM).

A representative method of enlarging the effective surface area of a storage node is disclosed in U.S. Pat. No. 5,162,248, issued to Charles H. Dennison et al., entitled "Optimized Contained Stacked Capacitor DRAM Cell Utilizing Sacrificial Oxide Deposition and Chemical Mechanical Polishing." In U.S. Pat. No. 5,162,248, a sacrificial oxide layer is used for making the shape of a storage node into a three-dimensional shape.

As semiconductor devices have become more highly integrated, another approach of using a high dielectric constant material, such as ditantalum pentaoxide ($Ta_2O_5$) or BST ($(Ba, Sr)TiO_3$), for the dielectric layer of a capacitor has been proposed. Use of such high dielectric constant materials for a dielectric layer requires that a capacitor electrode is formed of a metal layer, such as a titanium nitride (TiN) layer, instead of conductive polysilicon. That is, use of a metal-insulator-metal (MIM) structure for a capacitor has been favorably proposed.

When a metal electrode is used, it is difficult to form a storage node of a three-dimensional shape, such as cylinder, container or stack, using a sacrificial oxide layer. For example, a sacrificial oxide layer, which is adopted for forming a three-dimensional storage node, is utilized as a mold for making the shape of a storage node three-dimensional. An additional sacrificial oxide layer may be adopted for isolation of a storage node. It is preferable to remove this sacrificial oxide layer in a later process to obtain the maximum effective surface area of the storage node.

A sacrificial oxide layer is typically removed by a wet etching process. It is essential to introduce an etch stop layer under the sacrificial oxide layer in order to control the wet etching process. For such an etch stop layer, a silicon nitride layer is utilized. When such silicon nitride layer is utilized as an etch stop layer, an insulating layer under the etch stop layer may be damaged during a wet etching process for removing the sacrificial oxide layer. Put another way, an etchant used in the wet etching process may permeate along the border between the silicon nitride layer and the storage node into the underlying insulating layer and liquefy the insulating layer. This phenomenon is substantially caused by the low adhesive property between a silicon nitride layer and a metal electrode.

Since the insulating layer under the etch stop layer serves to support the storage node, the storage electrode may fall down or slant due to dissolution of the underlying insulating layer, thereby causing a defect in an electrode. Accordingly, to utilize a metal electrode as a capacitor electrode, it is desirable to adopt a new etch stop layer, which can prevent an underlying insulating layer from being corroded by an etchant.

SUMMARY OF THE INVENTION

To solve the above problem, a feature of an embodiment of the present invention is to provide a method of manufacturing an electrode of a capacitor using a new etch stop layer. The new etch stop layer can prevent an underlying insulating layer from being dissolved or an electrode from falling down or sinking due to a wet etching process for removing a residual sacrificial insulating layer, during formation of a three-dimensional capacitor electrode using a sacrificial insulating layer.

Specifically, an additional feature of an embodiment of the present invention provides a method of manufacturing an electrode of a capacitor. Initially, a lower insulating layer surrounding a conductive plug, which is electrically connected to a semiconductor substrate, is formed on the semiconductor substrate. Next, a support insulating layer is formed on the lower insulating layer. Then, an etch stop layer including a tantalum oxide layer is formed on the support insulating layer. Additionally, a mold sacrificial insulating layer is formed on the etch stop layer.

A mold, exposing the conductive plug, is formed by sequentially patterning the mold sacrificial insulating layer, the etch stop layer and the support insulating layer. The patterning for forming the mold is performed by dry etch. To control the extent of etching, an auxiliary etch stop layer may be formed on or under the tantalum oxide layer. The auxiliary etch stop layer may be formed of an aluminum oxide layer or a tantalum nitride layer.

A storage node layer covering the inner surface of the mold is formed on the mold such that the storage node layer is electrically connected to the conductive plug. A storage node is formed by separating the storage node layer. The residual mold sacrificial insulating layer that is exposed by the separation of the storage node layer is selectively etched and removed using the etch stop layer as an etch stopper.

Accordingly, the storage node having a three-dimensional shape, such as a cylindrical shape or a stack shape, is completed.

These and other features of the embodiments of the present invention will be readily apparent to those skilled in the art upon review of the detailed description that follows.

BRIEF DESCRIPTION OF THE DRAWINGS

The above features and advantages of the embodiments of the present invention will become more apparent by describing in detail preferred embodiments of the present invention with reference to the attached drawings wherein.

DETAILED DESCRIPTION OF PREFERRED EMBODIMENTS

Korean patent application number 99-57626, filed on Dec. 14, 1999, and entitled: "Method for Manufacturing Electrode of Capacitor," is incorporated by reference herein in its entirety.

Hereinafter, embodiments of the present invention will be described in detail with reference to the attached drawings. The present invention, however, is not restricted to the following embodiments, and many variations are possible within the sprit and scope of the present invention. The embodiments of the present invention are provided in order to explain more thoroughly the present invention to one skilled in the art. In the drawings, the shapes of members are exaggerated for clarity and like reference characters represent the same members throughout. In addition, when a film is described as being on another film or a semiconductor substrate, it can be directly on the other layer or the semiconductor substrate or an interlayer film may exist therebetween.

The embodiments of the present invention propose a new etch stop layer for controlling the removal of a sacrificial insulating layer when a capacitor electrode of a three-dimensional shape, such as a cylinder or a stack, is formed using the sacrificial insulating layer. The proposed etch stop layer can function as an etch stopper during a wet etching process for removing a sacrificial insulating layer. Additionally, the proposed etch stop layer can function as an etch stopper during a dry etching process used for forming a three-dimensional mold for a capacitor electrode.

Figure 1:
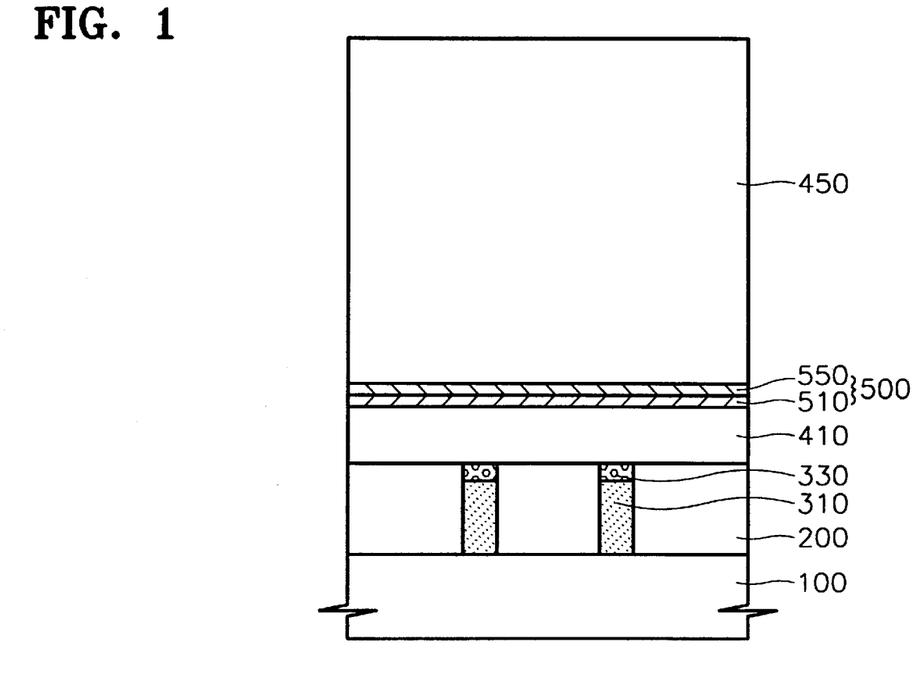
FIGS. 1 through 6 are schematic sectional views that illustrate a method for manufacturing a capacitor electrode according to a first embodiment of the present invention.

In a first embodiment of the present invention, FIG. 1 schematically illustrates a process of forming an etch stop layer 500 and a mold sacrificial insulating layer 450 on a semiconductor substrate 100. More specifically, a conductive plug 310, which will be electrically connected to a storage node, is formed on the semiconductor substrate 100 using a standard buried contact process. The conductive plug 310 is surrounded by a lower insulating layer 200 so that the conductive plug 310 may be insulated from other conductive patterns (not shown) such as gates, which are formed on the semiconductor substrate 100, while the conductive plug 310 is electrically connected to an active region in the semiconductor substrate 100. Put another way, the conductive plug 310 functions as a buried contact. The thickness of the lower insulating layer 200 varies with necessity, but may be about 4000–5000 Å depending on the thickness of the conductive plug 310.

The conductive plug 310 may be formed of various conductive materials, for example, conductive polysilicon. The conductive plug may be covered with a diffusion barrier layer 330. The diffusion barrier layer 330 may include an ohmic layer to serve as an ohmic contact.

On the semiconductor substrate 100 having topology as a result of forming such various patterns, a support insulating layer 410 is formed. The support insulating layer 410 serves to support a three-dimensional storage node so that the storage node does not fall down or collapse. The support insulating layer 410 may be formed of an insulating material, which is usually used when a semiconductor device is manufactured. For example, the support insulating layer 410 may be formed by depositing a silicon oxide ($SiO_2$) layer on the lower insulating layer 200 such that the conductive plug 310 is covered with the silicon oxide layer. The support insulating layer 410 must be formed to at least a minimum thickness for supporting a storage node. It is preferable that the support insulating layer 410 is formed to a thickness of about 2000–3000 Å.

Thereafter, the etch stop layer 500, which will be used in a later etching process, is formed on the support insulating layer 410. In one embodiment of the present invention, the etch stop layer 500 includes a tantalum oxide layer 510. For example, the tantalum oxide layer 510 is formed of ditantalum pentaoxide ($Ta_2O_5$) on the support insulating layer 410 by sputtering or chemical vapor deposition (CVD). The tantalum oxide layer 510 is preferably formed to at least the minimum thickness needed to stop etching. For example, the thickness of the tantalum layer 510 may be about 10–90 Å, but may vary depending on a later etching process.

An additional auxiliary etch stop layer 550 may be further formed on the tantalum oxide layer 510. The auxiliary etch stop layer 550 may be formed on or beneath the tantalum oxide layer 510, and functions as an etch stopper for controlling a dry etching process at a later stage. For the auxiliary etch stop layer 550, a silicon nitride layer or an aluminum oxide ($Al_2O_3$) layer may be used. The silicon nitride layer or the aluminum oxide layer may be formed by sputtering or CVD.

Next, the mold sacrificial insulating layer 450 is formed on the etch stop layer 500. The mold sacrificial insulating layer 450 is patterned to form a three-dimensional mold for a storage node. Although the thickness of the mold sacrificial insulating layer 450 may vary with necessity, the thickness is preferably set by taking into account the height of the storage node. For example, the mold sacrificial insulating layer 450 is formed of a silicon oxide layer having a thickness of about 10000–12000 Å.

Figure 2:
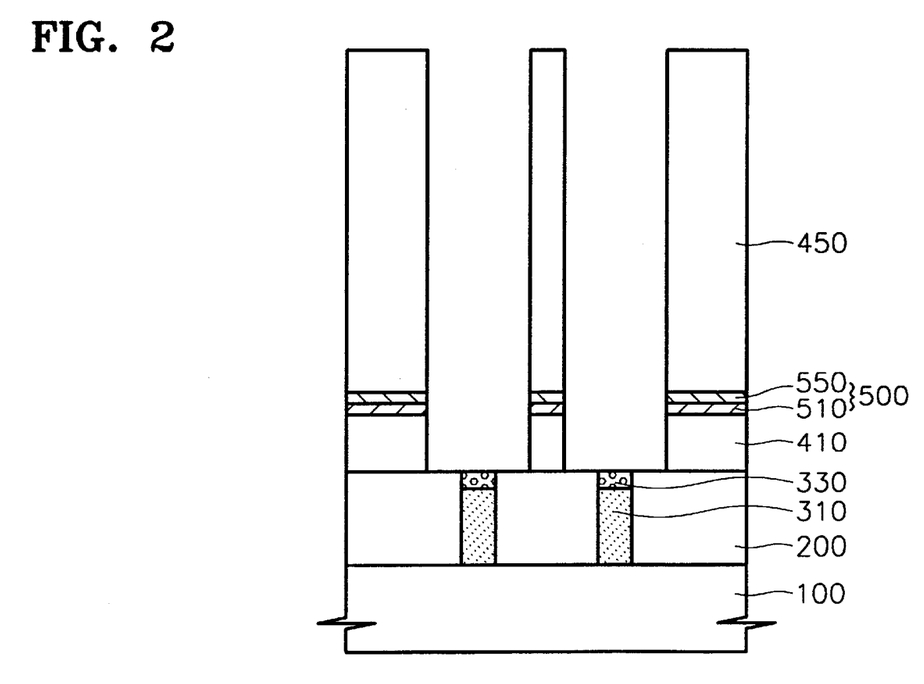

FIG. 2 schematically illustrates a process of forming a mold 410, 500 and 450 exposing the conductive plug 310. More specifically, the mold sacrificial insulating layer 450 is patterned by selective dry etching. After forming an etching mask (not shown) such as a photoresist pattern on the mold sacrificial insulating layer 450 using photolithography, the exposed mold sacrificial insulating layer 450 is etched using an etching gas suitable for etching silicon oxide of which the mold sacrificial insulating layer 450 is formed. For example, a mixture of oxygen gas, argon (Ar) gas and fluoride gas, such as $C_4F_8$ gas, is used as the etching gas.

The dry etching can be controlled by the etch stop layer 500. In other words, the tantalum oxide layer 510 of the etch stop layer 500 has a dry etching selectivity with respect to the mold sacrificial insulating layer 450, so that it can serve to stop the dry etch. For example, when an etching gas containing oxygen gas, argon (Ar) gas and $C_4F_8$ gas is used, ditantalum pentaoxide has an etching selectivity of about 2 with respect to silicon oxide, although the etching selectivity may vary with other etching conditions. Accordingly, the tantalum oxide layer 510 can be used as an etch stopper when dry etching the mold sacrificial insulating layer 450 which is formed of silicon oxide.

To control the extent of dry etching more reliably, as described above, the auxiliary etch stop layer 550 may be formed on the tantalum oxide layer 510. The auxiliary etch stop layer 550 is preferably formed of a material having a large dry etching selectivity with respect to the mold sacrificial insulating layer 450.

When the etching gas containing oxygen gas, argon (Ar) gas and $C_4F_8$ gas is used as described above, silicon nitride may have an etching selectivity of about 10 with respect to silicon oxide, although the etching selectivity may vary with other etching conditions. Aluminum oxide may have an etching selectivity of about 5 with respect to silicon oxide. Accordingly, by using an aluminum oxide layer or a silicon nitride layer as the auxiliary etch stop layer 550, the extent of dry etching can be more delicately controlled.

During the dry etching process, an etch stopper is detected due to the tantalum oxide layer 510 or the auxiliary etch stop layer 550. After the detection of the etch stopper, the dry etch is performed for a certain time, that is, over etch is performed by way of time etch, thereby exposing the conductive plug 310, and substantially the diffusion barrier layer 330.

With this patterning process, the mold sacrificial insulating layer 450, the etch stop layer 500 and the support insulating layer 410 are sequentially patterned, thereby forming the mold 410, 500 and 450 for forming a three-dimensional storage node.

Although FIGS. 1 and 2 illustrate an example in which the auxiliary etch stop layer 550 is formed on the tantalum oxide layer 510, the auxiliary etch stop layer 550 may be formed beneath the tantalum oxide layer 510 depending on the environment of fabrication. Moreover, the auxiliary etch stop layer 550 and the tantalum oxide layer 510 may be formed to be apart from each other.

Figure 3:
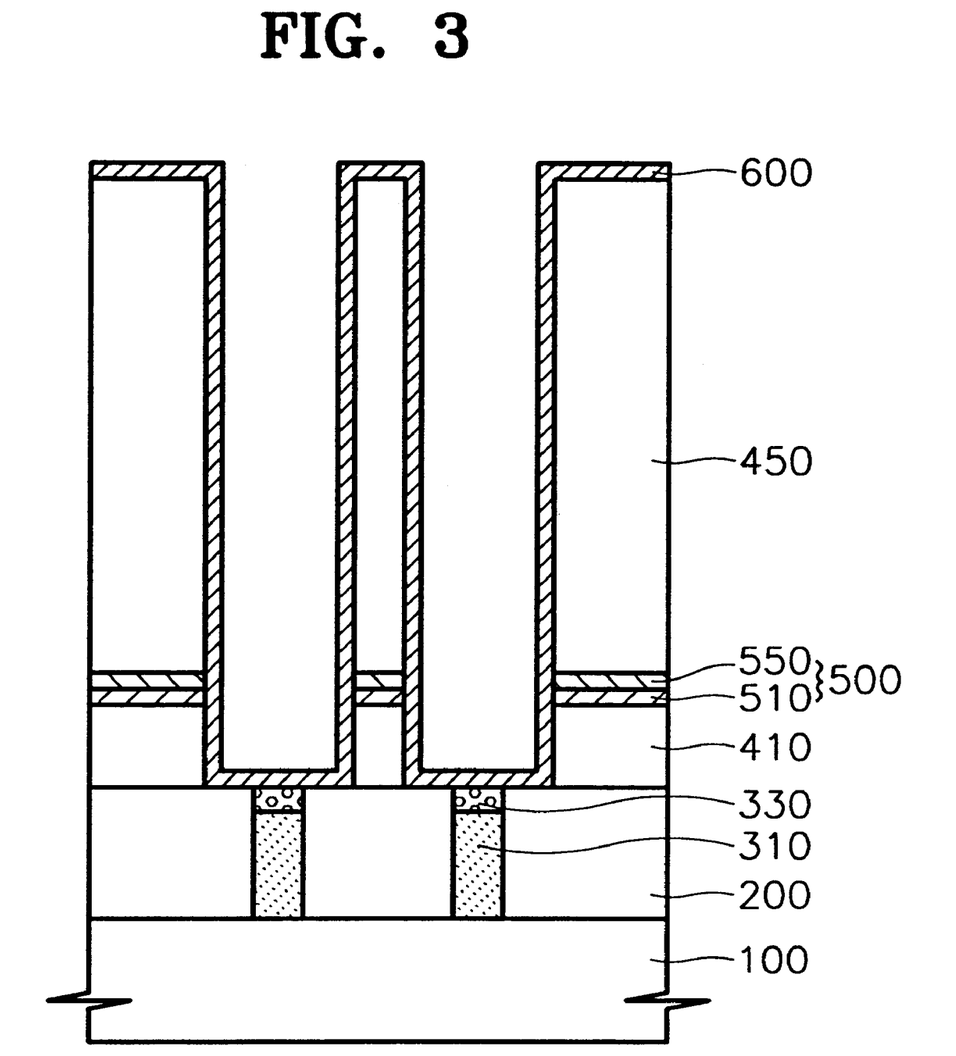

FIG. 3 schematically illustrates a process of forming a storage node layer 600 on the mold 410, 500 and 450. The thickness of the storage node layer 600 may vary with necessity. For example, the storage node layer 600 is deposited on the inner surface of the mold 410, 500 and 450 when forming a cylindrical storage node, and as a result, a recess is created due to the shape of the mold 410, 500 and 450. The storage node layer 600 is formed to be electrically connected to the conductive plug 310.

The storage node layer 600 preferably includes a metal layer in order to increase the capacitance of a capacitor. For example, the storage node layer 600 may be formed of a nitride metal layer such as a titanium nitride (TiN) layer, a titanium aluminum nitride (TiAlN) layer, a tantalum nitride (TaN) layer or a tungsten nitride (WN) layer. Alternatively, the storage node layer 600 may be formed of a platinum metal layer, such as a platinum (Pt) layer, a ruthenium (Ru) layer or an iridium (Ir) layer. An oxide metal layer such as a ruthenium oxide ($RuO_2$) layer or a strontium ruthenium oxide ($SrRuO_3$) may also be used. In addition, the storage node layer 600 may be formed of an existing conductive polysilicon layer, which is ordinarily used.

Figure 4:
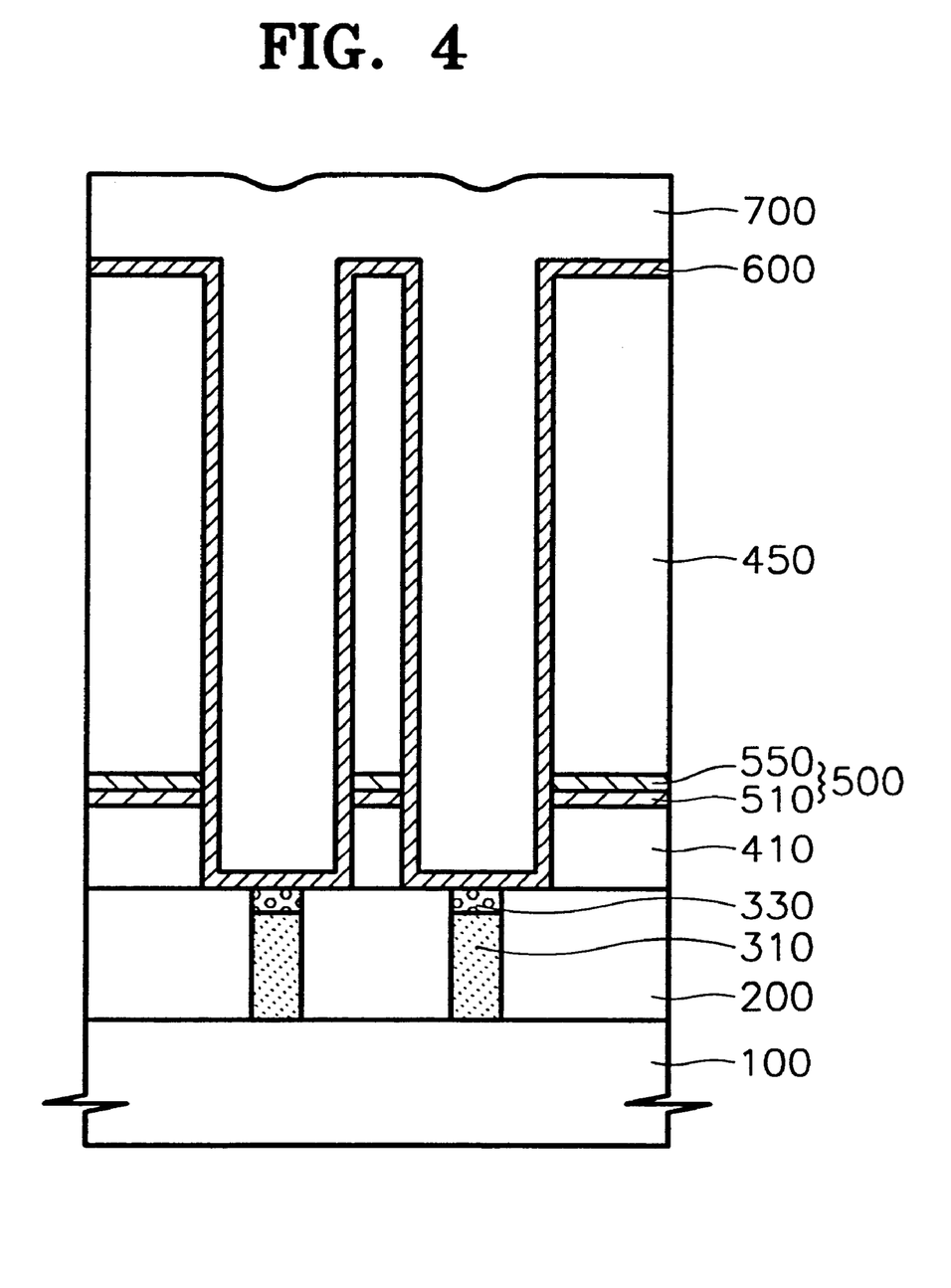

FIG. 4 schematically illustrates a process of forming an isolation sacrificial insulating layer 700 on the storage node layer 600. The isolation sacrificial insulating layer 700 is introduced for planarization by chemical mechanical polishing or etch back processing. The isolation sacrificial insulating layer 700 is formed on the storage node layer 600 to fill the recess of the resultant structure having the storage node layer 600. Since the isolation sacrificial insulating layer 700 must be removed after it is used for separating the storage node layer 600, it may be formed of various insulating materials, for example, silicon oxide.

Figure 5:
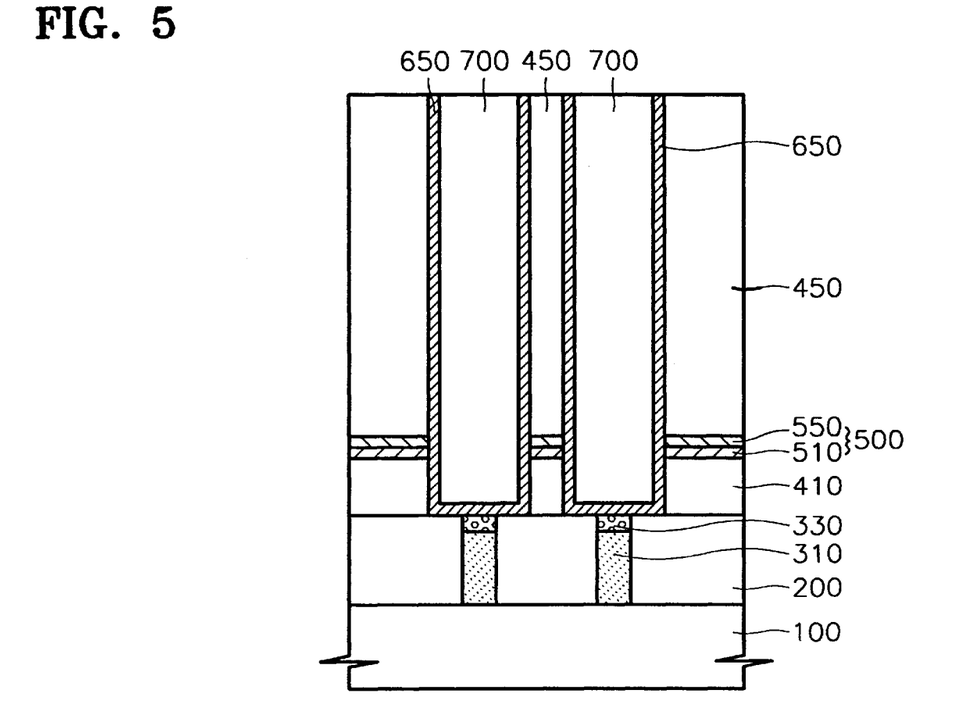

FIG. 5 schematically illustrates the result of performing planarization on the isolation sacrificial insulating layer 700 filling the recess of the resultant structure having the storage node layer 600. For example, chemical mechanical polishing is performed on the surface of the resultant structure having the isolation sacrificial insulating layer 700. Alternatively, planarization can be performed using an etch back process. Preferably, the chemical mechanical polishing or the etch back process is performed until the mold sacrificial insulating layer 450 is exposed. Accordingly, a part of the storage node layer 600 that is on the mold sacrificial insulating layer 450 and under the isolation sacrificial insulating layer 700 is removed. The part of the storage node layer 600 that is deposited on the inner surface of the mold 450, 500 and 410, however, remains after the removal, thereby forming separated storage nodes 650.

Figure 6:
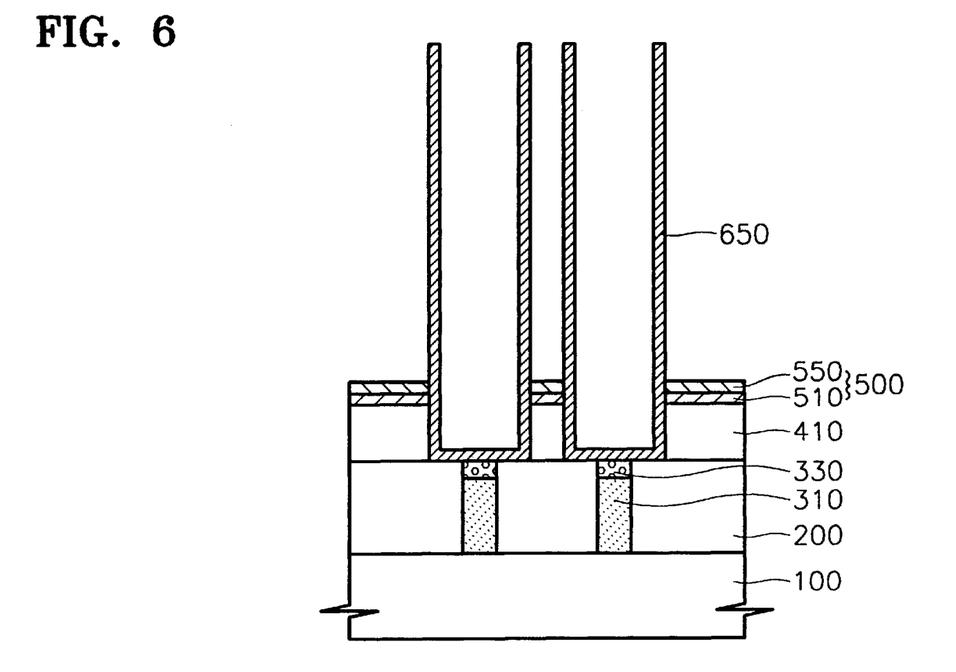

FIG. 6 schematically illustrates a process of removing the residual mold sacrificial insulating layer 450 and the isolation sacrificial insulating layer 700. More specifically, after the storage node 650 is formed by planarization, the residual mold sacrificial insulating layer 450 and the isolation sacrificial insulating layer 700 are selectively removed. The mold sacrificial insulating layer 450 and the isolation sacrificial insulating layer 700 are selectively removed by a wet etching process to leave the storage nodes 650 behind. An etchant, which is usually used for selective wet etching, may be used during the wet etching process. For example, an etchant containing an LAL solution or an HF solution is used to selectively wet etch the mold sacrificial insulating layer 450 and the isolation sacrificial insulating layer 700.

The wet etching process is controlled such that etching is stopped by the etch stopper 500 including the lower tantalum oxide layer 510. When the tantalum oxide layer 510 is used as a wet etch stopper, the etchant is prevented from permeating into the support insulating layer 410 or the lower insulating layer 200 via the border between the tantalum oxide layer 510 and the storage nodes 650. This result is proved by scanning electron microscope (SEM) images such as those shown in FIGS. 7 through 9.

Figure 7:
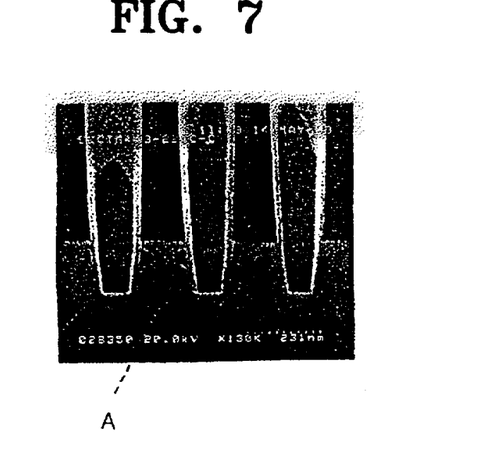
FIGS. 7 through 9 are scanning electron microscope images that depict the effects of a method for manufacturing a capacitor electrode according to an embodiment of the present invention.
Figure 8:
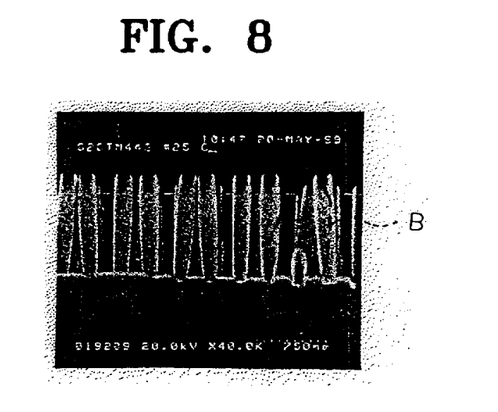

FIGS. 7 and 8 depict a problem occurring when a silicon nitride layer is used as a wet etch stopper. More particularly, when a typical silicon nitride layer is used as a wet etch stopper during a wet etching process for removing a mold sacrificial insulating layer or an isolation sacrificial insulating layer as described above, an underlying support insulating layer or lower insulating layer may be dissolved by the etchant. In other words, as depicted at A of FIG. 7, an etchant may permeate into and liquefy a support insulating layer. If this occurs deeply, a storage node may fall down or sink as shown at B of FIG. 8, causing defects. One may appreciate from this phenomenon that since the interface characteristic between a silicon nitride layer and a storage node is relatively poor, an etchant may permeate into an underlying layer via the interface when a typical silicon nitride layer is used as the etch stopper.

Figure 9:
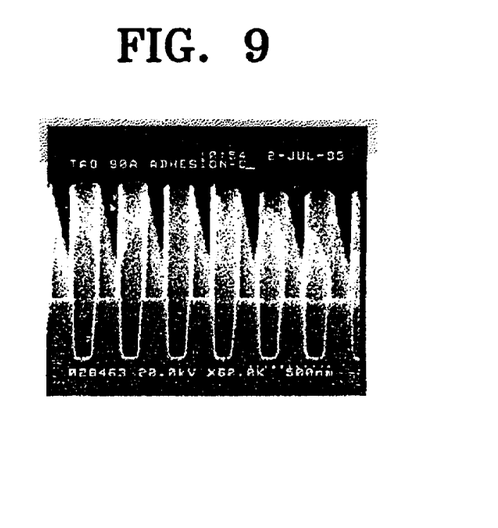

FIG. 9 schematically illustrates a resultant structure obtained when a tantalum oxide layer is used as a wet etch stopper according to an embodiment of the present invention. More specifically, when a tantalum oxide layer was used as a wet etch stopper according to an embodiment of the present invention, as shown in FIG. 9, the permeation of the etchant into the underlying support insulating layer or lower insulating layer was prevented. This result demonstrates that the tantalum oxide layer according to an embodiment of the present invention prevents the etchant from permeating into an underlying support insulating layer or lower insulating layer.

Referring back to FIG. 6, damage on the support insulating layer 410 or the lower insulating layer 200 by an etchant is restrained, and the residual mold sacrificial insulating layer 450 and the isolation sacrificial insulating layer 700 are removed by wet etch, thereby completing the cylindrical storage node 650.

Thereafter, typical processes of manufacturing a capacitor are performed on the storage node 650 to sequentially form a dielectric layer (not shown) and a plate node (not shown), thereby completing a capacitor of a semiconductor device.

Figure 10:
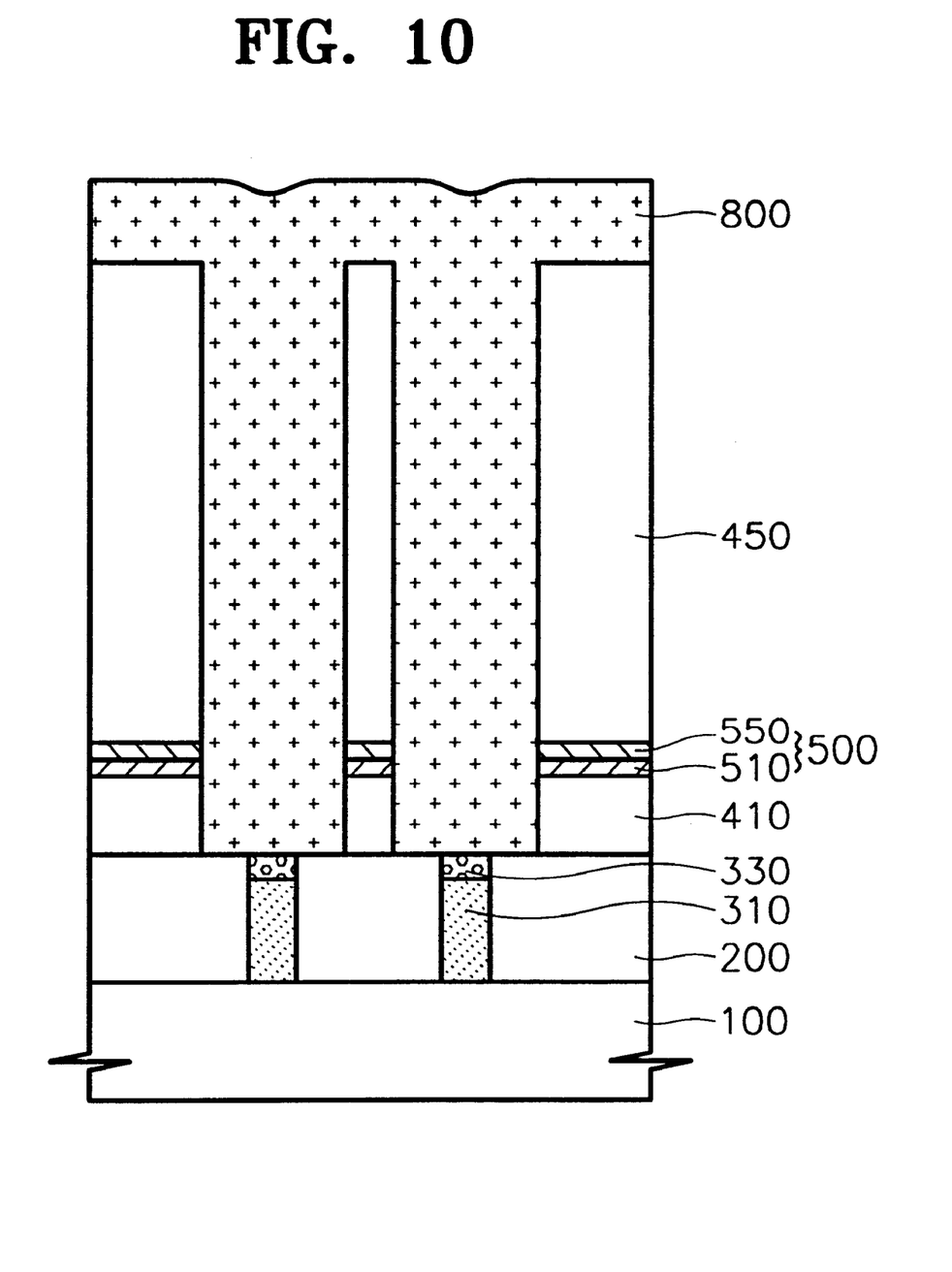
FIGS. 10 and 11 are schematic sectional views which illustrate a method for manufacturing a capacitor electrode according to a second embodiment of the present invention.
Figure 11:
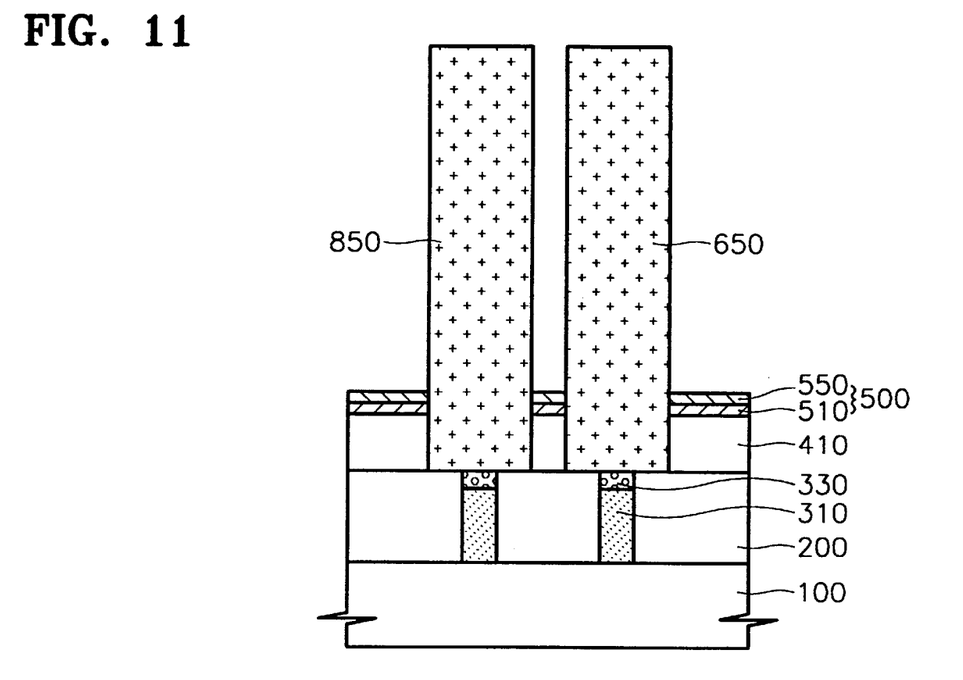

FIGS. 10 and 11 schematically illustrate a method for manufacturing a capacitor electrode according to a second embodiment of the present invention. Unlike the first embodiment, the second embodiment of the present invention provides a method of forming a stack-shaped storage node in manufacturing a capacitor electrode using a sacrificial insulating layer. The second embodiment demonstrates that the present invention can be adopted in manufacturing not only a cylindrically shaped storage node, but also a storage node of other three-dimensional shapes such as a stack shape. In the drawings of the first and second embodiments, like reference characters denote the same member.

As initially described with reference to FIGS. 1 and 2, the mold sacrificial insulating layer 450, the etch stop layer 500 and the support insulating layer 410 are sequentially patterned to form the mold 450, 500 and 410.

FIG. 10 schematically illustrates a process of forming a storage node layer 800 filling the recesses of the mold 450, 500 and 410. More specifically, the storage node layer 800 for filling the opening portions exposing the diffusion barrier layer 330 on the top of the conductive plug 310 is formed on the mold sacrificial insulating layer 450. The storage node layer 800 may be formed in substantially the same way as the storage node layer 600 of FIG. 3, as described in the first embodiment, with the exception that the storage node layer 800 of the second embodiment is formed to completely fill the opening portions.

FIG. 11 schematically illustrates a process of completing separated storage nodes 850. More particularly, the entire surface of the storage node layer 800 is planarized by chemical mechanical polishing or etch back processing to expose the underlying mold sacrificial insulating layer 450, thereby separating the storage nodes 850. Thereafter, as illustrated by FIG. 6, the residual mold sacrificial insulating layer 450 is removed by wet etching. At this time, as described with reference to FIG. 6, the underlying support insulating layer 410 can be prevented from being dissolved by an etchant by detecting the stop of the wet etch using the tantalum oxide layer 510.

With such an arrangement, the stack-shaped storage node 850 separated for each capacitor can be completed. Thereafter, a dielectric layer and a plate node are formed, thereby completing a capacitor.

Figure 12:
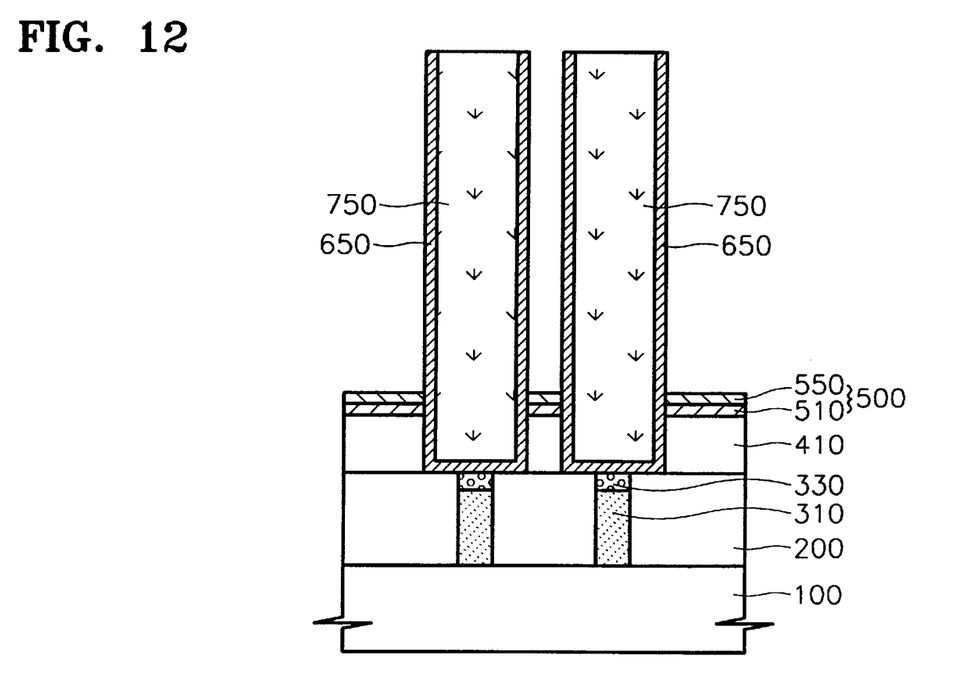
FIG. 12 is a schematic sectional view that illustrates a method for manufacturing a capacitor electrode according to a third embodiment of the present invention.

FIG. 12 schematically illustrates a method for manufacturing a capacitor electrode according to a third embodiment of the present invention. Unlike the first embodiment, the third embodiment separates cylindrically shaped storage nodes using an additional dielectric layer instead of forming the isolation sacrificial insulating layer. In the drawings depicting the first and third embodiments, like reference characters denote the same member.

As initially described with reference to FIGS. 1 through 3, the storage node layer 600 of FIG. 3 is formed. Thereafter, a dielectric layer 750 filling the recesses of the storage node layer is formed. In FIG. 4, the isolation sacrificial insulating layer 700 is introduced to fill the recesses of the storage node layer 600. In the third embodiment, as depicted in FIG. 12, the dielectric layer 750 is used to fill the recesses. Subsequently, the surface of the dielectric layer 750 is planarized by chemical mechanical polishing or etch back, thereby forming a separated storage node 650 for each capacitor.

Next, as described with reference to FIG. 6, the residual mold sacrificial insulating layer 450 is removed by wet etching. At this time, as illustrated by FIG. 6, the underlying support insulating layer 410 may be prevented from being dissolved by an etchant by detecting the stop of the wet etch using the tantalum oxide layer 510. With such an arrangement, the separated storage nodes 650 for each capacitor can be completed.

According to the present invention, a tantalum oxide layer is utilized as an etch stopper during a wet etching process for removing a sacrificial insulating layer such as a mold sacrificial insulating layer or an isolation sacrificial insulation layer used in the construction of a three-dimensional capacitor electrode. This tantalum oxide layer prevents an etchant used in the wet etching process from dissolving a support insulating layer or a lower insulating layer under the tantalum oxide layer. Therefore, the present invention is capable of preventing a capacitor electrode having a three-dimensional shape such as a cylindrical shape or a stack shape from falling down or sinking.

Although the invention has been described with reference to particular embodiments thereof, it will be apparent to one of ordinary skill in the art that modifications of the above-described embodiments may be made without departing from the spirit and scope of the invention.

What is claimed is:

1. A method for manufacturing an electrode of a capacitor, the method comprising:

forming, on a semiconductor substrate, a lower insulating layer surrounding a conductive plug, wherein the conductive plug is electrically connected to the semiconductor substrate;

forming a support insulating layer on the lower insulating layer;

forming an etch stop layer including a tantalum oxide layer on the support insulating layer;

forming a mold sacrificial insulating layer on the etch stop layer;

forming a mold exposing the conductive plug by sequentially patterning the mold sacrificial insulating layer, the etch stop layer and the support insulating layer;

forming, on the mold exposing the conductive plug, a storage node layer covering over the inner surface of the mold exposing the conductive plug such that the storage node layer is electrically connected to the conductive plug;

forming a storage node by separating the storage node layer; and selectively etching and removing the residual mold sacrificial insulating layer that is exposed by the separation of the storage node layer, using the etch stop layer to stop the etching process.

2. The method as claimed in claim 1, wherein forming the mold exposing the conductive plug is performed by a dry etching process.

3. The method as claimed in claim 2, wherein forming the etch stop layer comprises forming an auxiliary etch stop layer for stopping the dry etching process on the tantalum oxide layer.

4. The method as claimed in claim 2, wherein forming the etch stop layer comprises forming an auxiliary etch stop layer for stopping the dry etching process under the tantalum oxide layer.

5. The method as claimed in claim 3, wherein forming the auxiliary etch stop layer comprises forming an aluminum oxide layer.

6. The method as claimed in claim 3, wherein forming the auxiliary etch stop layer comprises forming a silicon nitride layer.

7. The method as claimed in claim 4, wherein forming the auxiliary etch stop layer comprises forming an aluminum oxide layer.

8. The method as claimed in claim 4, wherein forming the auxiliary etch stop layer comprises forming a silicon nitride layer.

9. The method as claimed in claim 1, wherein forming the storage node layer further comprises forming a conductive layer selected from the group consisting of a titanium nitride layer, a titanium aluminum nitride layer, a tantalum nitride layer, a tungsten nitride layer, a platinum layer, a ruthenium layer, an iridium layer, a ruthenium oxide layer, a strontium ruthenium oxide layer and a conductive polysilicon layer.

10. The method as claimed in claim 1, wherein forming the storage node layer further comprises filling the recess of the mold, which exposes the conductive plug, and
wherein forming the storage node further comprises planarizing the entire surface of the storage node layer to expose the mold sacrificial insulating layer under the storage node layer.

11. The method as claimed in claim 10, wherein the planarization is performed by chemical mechanical polishing the surface of the storage node layer such that the mold sacrificial insulating layer is exposed.

12. The method as claimed in claim 10, wherein the planarization is performed by etching back the surface of the storage node layer such that the mold sacrificial insulating layer is exposed.

13. The method as claimed in claim 1, wherein forming the storage node layer further comprises forming the storage node layer to cover the inner surface of the mold such that the storage node layer has a recess, which follows after the shape of the recess of the mold exposing the conductive plug, and
wherein forming the storage node comprises:
forming, on the storage node layer, an isolation sacrificial insulating layer filling the recess of the storage node layer; and
sequentially planarizing the isolation sacrificial insulating layer and the storage node layer, which covers the top of the mold sacrificial insulating layer, to expose the mold sacrificial insulating layer under the storage node layer.

14. The method as claimed in claim 1, wherein forming the storage node layer comprises forming the storage node layer to cover the inner surface of the mold exposing the conductive plug such that the storage node layer has a recess, which follows after the shape of the recess of the mold exposing the conductive plug, and
wherein forming the storage node further comprises:
forming, on the storage node layer, a dielectric layer filling the recess of the storage node layer; and
sequentially planarizing the dielectric layer and the storage node layer which covers over the top of the mold sacrificial insulating layer, to expose the mold sacrificial insulating layer under the storage node layer.

15. The method as claimed in claim 1, wherein removing the residual mold sacrificial insulating layer is performed by a wet etching process in which the extent of etching is controlled by the tantalum oxide layer.

16. A method for manufacturing an electrode of a capacitor, the method comprising:
forming, on a semiconductor substrate, a lower insulating layer surrounding a conductive plug, wherein the conductive plug is electrically connected to the semiconductor substrate;
forming a support insulating layer on the lower insulating layer;
forming an etch stop layer including a tantalum oxide layer on the support insulating layer;
forming a mold sacrificial insulating layer on the etch stop layer;
forming a mold exposing the conductive plug by sequentially and selectively patterning the mold sacrificial insulating layer, the etch stop layer and the support insulating layer;
forming, on the mold exposing the conductive plug, a storage node layer along the inner surface of the mold, the storage node layer being electrically connected to the conductive plug;
forming, on the storage node layer, an isolation sacrificial insulating layer filling a recess resulting from the shape of the mold exposing the conductive plug;
forming a cylindrical storage node by sequentially planarizing the isolation sacrificial insulating layer and the storage node layer, which covers the top of the mold sacrificial insulating layer, to expose the mold sacrificial insulating layer; and
selectively etching and removing the isolation sacrificial insulating layer and the residual mold sacrificial insulating layer that is exposed by the separation of the storage node layer, using the tantalum oxide layer as an etch stopper.

17. The method as claimed in claim 16, wherein forming the mold exposing the conductive plug is performed by a dry etching process.

18. The method as claimed in claim 17, wherein forming the etch stop layer comprises forming an auxiliary etch stop layer for stopping the dry etching on the tantalum oxide layer.

19. The method as claimed in claim 17, wherein forming the etch stop layer comprises forming an auxiliary etch stop layer for stopping the dry etching under the tantalum oxide layer.

20. The method as claimed in claim 18, wherein forming the auxiliary etch stop layer comprises forming an aluminum oxide layer.

21. The method as claimed in claim 18, wherein forming the auxiliary etch stop layer comprises forming a silicon nitride layer.

22. The method as claimed in claim 19, wherein forming the auxiliary etch stop layer comprises forming an aluminum oxide layer.

23. The method as claimed in claim 19, wherein forming the auxiliary etch stop layer comprises forming a silicon nitride layer.

24. The method as claimed in claim 16, wherein forming the storage node layer comprises forming a conductive layer selected from the group consisting of a titanium nitride layer, a titanium aluminum nitride layer, a tantalum nitride layer, a tungsten nitride layer, a platinum layer, a ruthenium layer, an iridium layer, a ruthenium oxide layer, a strontium ruthenium oxide layer and a conductive polysilicon layer.

25. The method as claimed in claim 16, wherein removing the residual mold sacrificial insulating layer and the isolation sacrificial insulating layer is performed by a wet etching process.

26. The method as claimed in claim 16, wherein the planarization is performed by chemical mechanical polishing the surface of the isolation sacrificial insulating layer, so that the mold sacrificial insulating layer is exposed.

27. The method as claimed in claim 16, wherein the planarization is performed by etching back the surface of the isolation sacrificial insulating layer, so that the mold sacrificial insulating layer is exposed.

* * * * *